United States Patent
Horeth et al.

(10) Patent No.: US 7,082,586 B2
(45) Date of Patent: Jul. 25, 2006

(54) METHOD AND ARRANGEMENT FOR THE COMPARISON OF TECHNICAL SYSTEM BY MEANS OF SYSTEM REPLACEMENTS

(75) Inventors: Stefan Horeth, Glonn (DE); Peter Warkentin, Oberhaching (DE)

(73) Assignee: OneSpin Solutions, GmbH, Munich (DE)

( * ) Notice: Subject to any disclaimer, the term of this patent is extended or adjusted under 35 U.S.C. 154(b) by 0 days.

(21) Appl. No.: 10/363,586

(22) PCT Filed: Aug. 23, 2001

(86) PCT No.: PCT/DE01/03219

§ 371 (c)(1),
(2), (4) Date: Aug. 28, 2003

(87) PCT Pub. No.: WO02/21344

PCT Pub. Date: Mar. 14, 2002

(65) Prior Publication Data

US 2004/0039541 A1    Feb. 26, 2004

(30) Foreign Application Priority Data

Sep. 5, 2000   (DE)  ............................... 100 43 759
Feb. 7, 2001   (DE)  ............................... 101 05 584

(51) Int. Cl.
    *G06F 17/50*    (2006.01)
(52) U.S. Cl. ............................................. 716/5; 716/4
(58) Field of Classification Search ................ 716/4–5, 716/37, 724, 742; 324/527, 765; 702/117, 702/118; 703/14–16
See application file for complete search history.

(56) References Cited

FOREIGN PATENT DOCUMENTS

| EP | 0 828 215 A1 | 3/1998 |
|---|---|---|
| WO | WO 99/50766 | 10/1999 |
| WO | WO 00/26825 | 5/2000 |

OTHER PUBLICATIONS

Huang et al., "Aquila: An Equivalence Checking System for Large Sequential Designs," IEEE, May 2000, pp. 443-464.*
Liu et al., "An Efficient Functional Coverage Test for HDL Description at RTL," IEEE, Oct. 1999, pp. 1-3.*
Cerny et al., "Verification of Real Time Controllers Against Timing Diagram Sepcification Using Constraint Logic Programming," IEEE, Oct. 1999, PP.*

(Continued)

*Primary Examiner*—Vuthe Siek
(74) *Attorney, Agent, or Firm*—24IP Law Group USA, PLLC; Timothy R. DeWitt

(57) ABSTRACT

The invention permits a comparison of two technical systems, which according to conventional opinion is not possible to carry out, based on a substantially simpler, technically achievable comparison, in which part systems of one or both systems are specifically replaced. The replacements are performed in a controlled manner by monitoring a replacement condition with constraints. The monitoring of the replacement condition and the generation and monitoring of the necessary constraints occur automatically. A comparison of both systems can thus be carried out based on the replacement of the part systems without introducing a loss of precision in the comparison.

8 Claims, 1 Drawing Sheet

OTHER PUBLICATIONS

Kumar et al., "Logic and Functional Verification in a Commercial Semiconductor Environment," IEEE, Mar. 1998, pp. 1-8.*

Carl Pixley, et al.: Multi-level Synthesis for Safe Replaceability, IEEE/ACM Digest of Technical Papeers, IEEE/ACM International Conference on CAD-94, IC-CAD94, pp. 442-449, 1994.

International Preliminary Examination Report dated Feb. 27, 2003 (10 pp) for International Application No. PCT/DE01/03219 (in German).

International Preliminary Examination Report dated Feb. 27, 2003 ( 8 pp) for International Application No. PCT/DE01/03219 (English Translation).

* cited by examiner

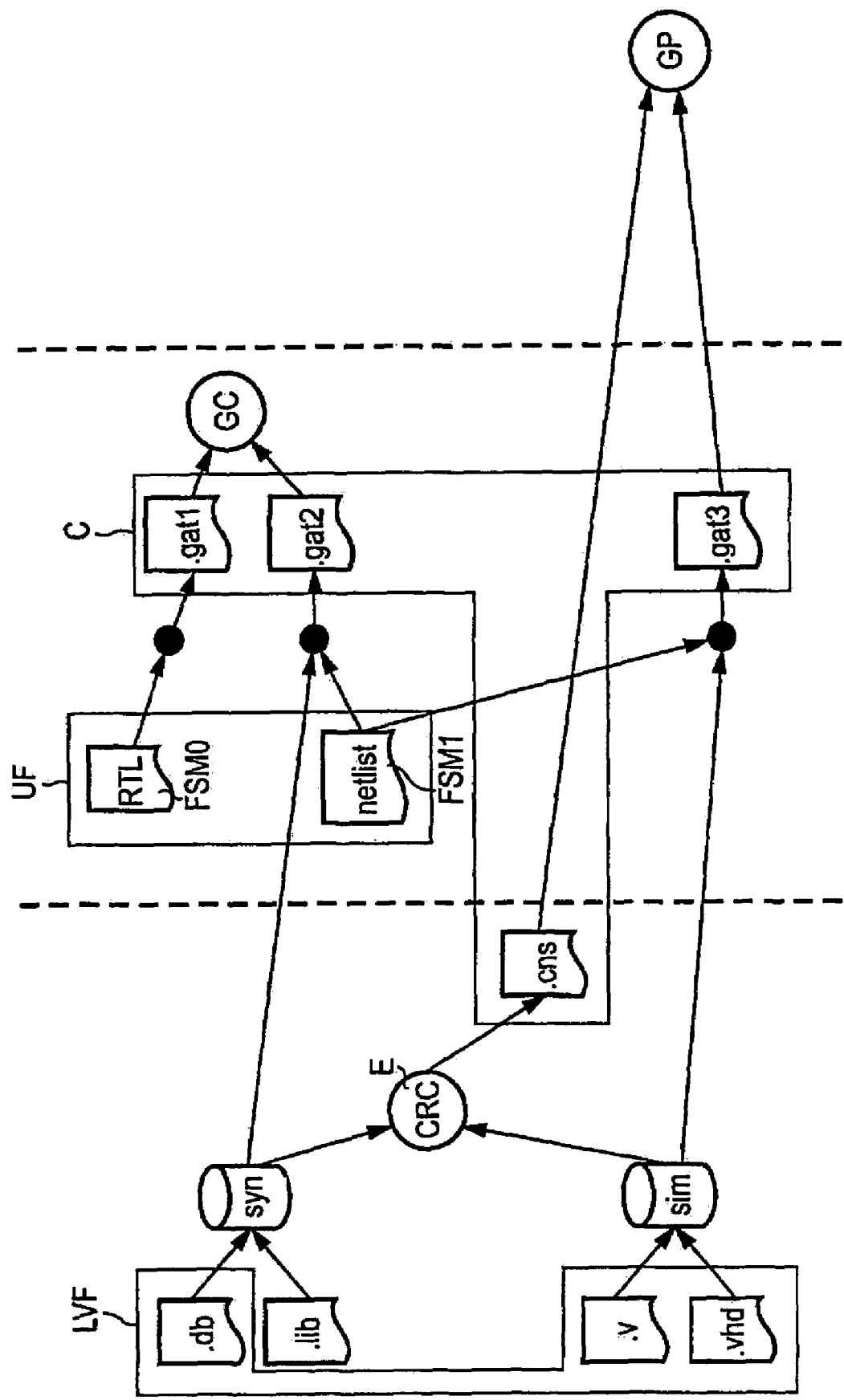

METHOD AND ARRANGEMENT FOR THE COMPARISON OF TECHNICAL SYSTEM BY MEANS OF SYSTEM REPLACEMENTS

BACKGROUND OF THE INVENTION

1. Field of the Invention

The invention relates to a method for the comparison of technical systems to check functional equivalence by means of system replacements.

2. Description of Related Art

As is known, even minor internal behaviour differences can easily lead to failure in the comparison of technical systems, in particular if large and complex systems are concerned.

In the case of such larger technical systems as, for instance, Application Specific Integrated Circuits (ASICs), at present there is no durable and satisfactory method of solving this problem.

Depending on the particular scope of application, there are a few known ideas to solve this problem.

A possible scenario, in which the above problem can occur, is implementation verification, when the synthesis results are to be compared to the synthesis inputs, in order to ensure that the synthesis process has not introduced any modifications into the functionality of the synthesis inputs.

Here especially the handling of so-called "library cells", which serve as a simple way to illustrate the synthesis result, has shown to be problematic. Here, a large degree of freedom exists for modelling the internal behaviour of the library cells.

A popular method now consists of modifying the internal logic based on heuristics and in particular encoding of the internal states of the library cells so that the internal behaviour of the parts representing the library cell is exactly evident from the synthesis inputs.

Since these techniques work without knowledge of the synthesis inputs exclusively on the library cells and due to the extraordinarily large number of possible uses of library cells it is hardly to be avoided that this procedure is incomplete and error-prone.

Suitable modelling of library cells, however, is the basic pre-requisite for successful implementation verification.

An example of a known solution is FormalPro (™) software, an implementation verification tool developed by the firm Mentor Graphics. This uses heuristics, in order to deal with various problem scenarios in regard to library cells (see in this connection Hughes, Roger B.: Whole design formal verification of a 5-million gate design by equivalence checking is possible with a small memory footprint, Design-Con2000, February 2000).

Essentially, as a result of this idea, an attempt is made to find a standard format to illustrate the library cells. This solution moreover supports the aforementioned statement, according to which library cells represent a special problem.

The solution proposed by the invention overcomes these fundamental problems and can be used in numerous application scenarios.

SUMMARY OF THE INVENTION

It is, therefore, a primary object of the present invention to find an idea to support the comparison of technical systems, which is also feasible if the systems being compared deviate from one another in regard to their internal behaviour. This should also apply in particular to the aforementioned, problematic library cells.

In accordance with the present invention, this object is achieved by a method for the comparison of technical systems to check equal functionality by means of system replacements with a first technical system and a replacement system, whereby the following process steps are carried out to establish agreement between both systems:

a) automatic monitoring as to whether the first technical system can be replaced by the replacement system with a replacement condition, according to which it is not possible for any environment of the technical systems to find a functional difference between the first technical system and the replacement system when the respective interfaces are accessed.

b) otherwise automatic constraint of the behaviour of the environment of both systems and renewed monitoring of the replacement condition with the restricted environment, c) repetition of process step b) until the replacement condition can be demonstrated or no further constraint of the environment is possible.

The basic idea of this invention is, therefore, essentially that modifications to technical systems are frequently of a very local nature and can be limited to certain areas of the systems. In many application scenarios, the modified areas are known and can be placed in relation to their original form. Therefore, modified critical parts of an entire system can then be identified and replaced by a non-critical replacement system.

For this purpose, a check is made for a given technical system and a given replacement system as to whether the technical system can be replaced by the replacement system. The replacement condition is selected so that it is not possible for any environment of the technical system to find a difference between the technical system and the replacement system, if for said monitoring only the interfaces of the technical system or its replacement system may be accessed.

Therefore, it is ensured that the technical system and its replacement system behave identically at their interfaces under all operating conditions.

If the replacement condition is not fulfilled, then constraints are generated automatically in the behaviour of the environment, so that the replaceability of the two systems can nevertheless be ensured with these constraints.

A first advantageous configuration of the method in accordance with the present invention is characterized in that the environment of the two technical systems being compared is restricted, by monitoring these for values potentially appearing at their outputs and by reducing the environment by such input values, which entail an output value, which cannot be generated by the other system under any circumstances.

A further or alternative embodiment of the invention performs a constraint of the environment of the two technical systems being compared by forming that classes of inputs and by restricting the environment is restricted in such a way that inputs of different classes do not change at the same time. This can occur both as an alternative to the aforementioned possibility of constraint, and as a supplementary measure, if the first mentioned constraint does not lead to success, that is to say the replacement condition cannot be demonstrated.

In this case, it has been shown as advantageous if classes of inputs are progressively partitioned until the replacement condition can be demonstrated or no further partitioning is possible.

Formally, replaceability can also be understood as a special case of replaceability with constraints, if the constraints are logically always true, that is to say fulfilled by any environment.

Therefore, advantageously such constraints are always automatically monitored as to whether these are logically always true for any environment. Constraints in the environment are best monitored automatically using a tool, which already exists. If the constraints are fulfilled in the environment being monitored, then the replacement system is replaced whenever the technical system appears.

As a result, the comparison of two entire systems is reduced to the comparison of two systems, in regard to which one or more part systems have been replaced in relation to the original entire systems.

It is important and advantageous in this case that, despite said replacements, no loss of precision is introduced in the comparison.

The basic idea of the invention, therefore, is to reduce a comparison of two technical systems which according to conventional opinion is not possible to a substantially simpler, technically achievable comparison in which part systems of one or both systems are specifically replaced. The replacements are performed in a controlled manner by monitoring a replacement condition with constraints. The monitoring of the replacement condition just as the generation and monitoring of the necessary constraints occur automatically. A comparison of both systems can thus be carried out based on the replacements of the part systems, without introducing a loss of precision in the comparison.

The choice of the replacement system essentially depends on the application scenario. To assist understanding, an embodiment for implementation verification of a digital technical system is described below based on the library cells already identified as being problematic.

BRIEF DESCRIPTION OF THE DRAWINGS

Alongside this and in association with the figure, further advantages and details of the invention are clarified, where:

FIG. 1 shows a diagrammatic representation of implementation verification based on replacements of library cells in accordance with the invention.

DETAILED DESCRIPTION OF THE INVENTION

Firstly, for this purpose, the replacement condition E (safe replaceability) of technical systems is dealt with in greater detail. Such a replacement condition E for a technical system, which is represented by finite state systems (FSMs), has already been defined in "Pixley, Carl; Singhal, Vigyan; Aziz, Adnan; Brayton, Robert K.: multi-level synthesis for safe replaceability; ICCAD94, pages 442–449, 1994".

Further basic principles are evident from:

Hasteer, Gagan; Mathur, Anmol; Banerjee, Prithviraj: an implicit algorithm for finding steady states and its application to FSM verification; DAC98, pages 611–614, 1998.

Singhal, Vigyan; Pixley, Carl: the verification problem for safe replaceability, CAV94, pages 311–323, 1994.

Singhal, Vigyan; Pixley, Carl; Rudell, Richard L; Brayton, Robert K.: the validity of retiming sequential circuits. DAC95, pages 316–321, 1995.

The definition presented below extends the term of replaceability to replaceability with constraints.

Definition:

A technical system FSM1 is called replaceable by a technical system FSM0 with the constraint C (FSM1 $\subset_c$ FSM0), if a state S0 of the system FSM0 exists for each state S1 of the system FSM1 and for each sequence of input values, so that both the constraint C is considered by the sequence of input values observed and the sequence of the output values for S0 also agrees at the same time with the sequence for S1 for the input sequence observed.

It can be shown that this definition is a necessary and sufficient condition for the replaceability of technical systems, so that the replacement cannot be detected by any environment, in which the constraint C applies and which is only able to analyze the input or output values of FSM1 or FSM2.

The replacement condition according to the above definition can be demonstrated mathematically in numerous ways. Known automated methods include, for example, BDD, ROBDD, ATPG, SAT or also simulation-based methods.

In accordance with the invention, the constraint C is determined from the aforementioned definition by monitoring the systems for values potentially appearing at their outputs. Those input values, which—irrespective of internal states—(can) entail an output value, that cannot be generated under any circumstances by the other system, are then added to the constraint C.

If the replacement condition cannot be demonstrated by means of the constraints described above via the permitted input values, then classes K of inputs are formed and the constraint. C is included, so that inputs from different classes K will not change at the same time. The partitioning process into classes K continues, until the replacement condition is finally demonstrated or no further partitioning is possible. In the latter case, the systems cannot be replaced.

The aforementioned embodiment will now be explained in more detail below.

As previously mentioned, library cells are an ideal application scenario for the invention presented here.

For this purpose, FIG. 1 shows the interaction of the various tools in the example of implementation verification of a digital technical system, e.g. for producing an ASIC.

In the case of the implementation verification of a digital system, the object of comparison consists in checking functional equivalence between the synthesis input RTL (here as FSM0) and the synthesis result 'netlist' (here as FSM1). 'Netlist' and 'RTL' thereby represent the user files UF (user files), where 'netlist' is synthesized 'syn' from 'RTL' by means of the synthesis library 'db'. The library 'db' contains the synthesis models of the library cells and is a component part of the library data files supplied by the LVF (library vendor files) tool developer, which also includes the input formats VHDL '.vhdL' and Verilog '.v'.

The implementation verification will now demonstrate that the netlist 'netlist' is functionally identical to the synthesis input 'RTL', by means of the simulation models 'sim' of the library cells. Under this assumption, time-consuming functional simulation of the netlist 'netlist' can be avoided and characteristics of the circuit can be checked for 'RTL'. The simulation models in 'sim' can have various input formats, such as for instance the VHDL '.vhd' or Verilog '.v' already mentioned.

It is now problematic that the simulation models 'sim' are only aligned with high efficiency of a simulator and their internal realization has no predictable relationship to the internal realization of the synthesis models of the library '.db'.

A synthesis input 'RTL', however, has a direct structural relationship to the netlist 'netlist' via the synthesis library '.db', since the synthesis process performs so-called mapping of the synthesis cells, in which the internal architecture of the library cells is taken into consideration. Expressed in other words, the internal behaviour of the netlist 'netlist' has a direct structural relationship to the synthesis input 'RTL' via the synthesis models 'syn' of the library 'db'. This structural relationship is a crucial factor in the technical feasibility of formal verification.

At the same time, there is frequently no structural relationship between 'RTL' and 'netlist' using the simulation models in 'sim'. The internal realization of the simulation models can differ within a wide range from the synthesis models in '.db'; synthesis models and simulation models only have an equivalent relationship via their input/output behaviour.

The CRC tool, which is associated with the invention described here and works accordingly, monitors the replaceability of the synthesis models in 'syn' and of the simulation models in 'sim' and, if necessary, generates the constraints C required for replaceability or replacement constraints '.cns'. In the illustration, 'syn' is demonstrative of various representational formats of the synthesis library '.db', thus for example also in regard to the format 'lib', which serves as a source for the generation of '.db'.

The constraints generated by CRC are validated from the netlist 'netlist' by means of the simulation models in 'sim' via an intermediate representation '.gat3' using a tool GP. If the comparison turns out to be positive, then replaceability is ensured and the synthesis models from 'syn' are consulted during implementation verification. The further method of implementation verification does not differ from the basic procedure by means of the simulation models from 'sim' (in FIG. 1 indicated by intermediate representations '.gat1', '.gat2' as well as the tool GC).

In first experiments with the method carried out in this way using the CRC tool (CVE replacement checkers), the verification of an ASIC was possible for the first time, which previously could not be checked automatically.

In other cases, the time required for implementation verification was reduced from a few hours to a few minutes.

Also, the outputs of synthesis tools in the case of FSM recoding and optimization, as for example used in the design of field programmable gate arrays (FPGAs), are a further promising field of application for the invention presented.

These synthesis tools are able to generate recoding of the internal states of part systems of the FPGA. To carry out implementation verification of FPGAs—similar to the procedure in the preceding embodiment—the recoded part systems can be replaced by means of the present invention with their originals, in order then to carry out implementation verification. Replaceability of original system and recoded system can again be monitored with the CRC tool, which at the same time also generates the constraints demanded by the environment.

In principle, therefore, the procedure is the same as that shown in connection with FIG. 1. Only the origin of the replacement system is different.

The invention claimed is:

1. Method for a comparison of circuit specifications to check equal functionality, whereby a first circuit specification having input/output interfaces is compared with a replacement circuit specification having input/output interfaces and whereby the following process steps are carried out to establish an equivalent technical functionality of the first circuit specification and the replacement circuit specification:
   a) automatic monitoring as to whether the first circuit specification can be replaced by the replacement specification under a replacement condition, according to which it is not possible for an environment comprising input values to be fed to said input interfaces of the first circuit specification and the replacement specification to find a functional difference between the first circuit specification and the replacement specification,
   b) if the replacement condition is not demonstrated, constraining possible input values of the environment and renewed monitoring of the replacement condition with the constrained environment, whereby a constraint of the environment of the two circuit specifications being compared takes place by forming classes of inputs and by restricting the environment so that inputs of different classes will not change at the same time,
   c) repetition of process step b) until the replacement condition is demonstrated or no further constraint of the environment is possible, and
   d) if the replacement condition could be demonstrated, replacement of the first circuit specification by the replacement specification and comparison of the replacement specification with the second circuit specification to check functional equivalence.

2. Method for the comparison of circuit specifications according to claim 1 whereby a constraint of the environment of the two circuit specifications being compared takes place by monitoring these circuit specifications for values potentially appearing at their output interfaces and by constraining the environment by excluding such input values, which entail an output value, which cannot be generated by the other system by applying input values to said input interfaces.

3. Method for the comparison of circuit specifications according to claim 1 whereby progressive partitioning into classes of inputs continues until the replacement condition is demonstrated or no further partitioning is possible.

4. Method for the comparison of circuit specifications according to claim 1 whereby constraints are always automatically monitored as to whether these constraints are always fulfilled for any environment.

5. Method for the comparison of circuit specifications according to claim 1 whereby constraining possible input values of the environment of the first circuit specification includes:
   monitoring the first circuit specification and the replacement specification for values potentially appearing at their output interfaces and
   reducing the environment by such input values, which entail said output values.

6. Method for the comparison of circuit specifications according to claim 1 whereby constraining possible input values of the environment of the first circuit specification includes:
   forming classes of inputs; and
   restricting the environment in such a way that inputs of different classes of inputs do not change at the same time.

7. Method for a comparison of circuit specifications to check equal functionality, whereby a first circuit specification having input/output interfaces is compared with a replacement circuit specification having input/output interfaces and whereby the following process steps are carried out to establish an equivalent technical functionality of the first circuit specification and the replacement circuit specification:

a) automatic monitoring as to whether the first circuit specification can be replaced by the replacement specification under a replacement condition, according to which it is not possible for an environment comprising input values to be fed to said input interfaces of the first circuit specification and the replacement specification to find a functional difference between the first circuit specification and the replacement specification, b) if the replacement condition is not demonstrated, constraining possible input values of the environment and renewed monitoring of the replacement condition with the constrained environment, whereby constraining possible input values of the environment of the first circuit specification further comprises:

forming classes of inputs, restricting the environment in such a way that inputs of different classes of inputs do not change at the same time, monitoring the first circuit specification and the replacement specification for values potentially appearing at their output interfaces and reducing the environment by such input values, which entail said output values, c) repetition of process step b) until the replacement condition is demonstrated or no further constraint of the environment is possible, and d) if the replacement condition could be demonstrated, replacement of the first circuit specification by the replacement specification and comparison of the replacement specification with the second circuit specification to check functional equivalence.

8. Method for a comparison of circuit specifications to check equal functionality, whereby a first circuit specification having input/output interfaces is compared with a second circuit specification having input/output interfaces and whereby the following process steps are carried out to establish an equivalent technical functionality of the first circuit specification and the second circuit specification:

a) automatic monitoring as to whether the first circuit specification can be replaced by the second specification under a replacement condition, according to which it is not possible for an environment comprising input values to be fed to said input interfaces of the first circuit specification and the second specification to find a functional difference between the first circuit specification and the second specification, b) if the replacement condition is not demonstrated, constraining possible input values of the environment and renewed monitoring of the replacement condition with the constrained environment, whereby constraining possible input values of the environment of the first circuit specification further comprises:

forming classes of inputs, and restricting the environment in such a way that inputs of different classes of inputs do not change at the same time, c) repetition of process step b) until the replacement condition is demonstrated or no further constraint of the environment is possible, and d) if the replacement condition could be demonstrated, replacement of the first circuit specification by the second specification and comparison of the replacement specification with the second circuit specification to check functional equivalence.

* * * * *